United States Patent [19]

Kondoh et al.

[11] Patent Number: 5,371,421
[45] Date of Patent: Dec. 6, 1994

[54] LOW POWER BIMOS AMPLIFIER AND ECL-CMOS LEVEL CONVERTER

[75] Inventors: Harufusa Kondoh; Atsushi Ohba, both of Itami, Japan

[73] Assignee: Mitsubishi Denka Kabushiki Kaisha, Tokyo, Japan

[21] Appl. No.: 29,686

[22] Filed: Mar. 11, 1993

[30] Foreign Application Priority Data

Mar. 18, 1992 [JP] Japan ................................. 4-062153

[51] Int. Cl.⁵ ................ H03K 19/0175; H03K 19/01;
[52] U.S. Cl. ........................................ 326/73; 326/109
[58] Field of Search ................ 307/443, 451, 446, 475

[56] References Cited

U.S. PATENT DOCUMENTS

| | | | |
|---|---|---|---|
| 4,724,343 | 2/1988 | Le Roux et al. | 307/446 |
| 4,845,381 | 7/1989 | Cuevas | 307/451 |
| 4,864,159 | 9/1989 | Cornelissen | 307/475 |
| 4,978,870 | 12/1990 | Chen et al. | 307/451 |
| 5,075,580 | 12/1991 | Dayton et al. | 307/475 |
| 5,075,581 | 12/1991 | Kamata | 307/446 |
| 5,134,319 | 7/1992 | Yamaguchi | 307/446 |

FOREIGN PATENT DOCUMENTS

4010145C1 3/1990 Germany .

OTHER PUBLICATIONS

The Journal of the Institute of Electronics and Communication Engineers of Japan, vol. J74-C-II, No. 6, Jun. 1991, pp. 532-540, "64K×1 BiMOS ECL RAM with Cross Coupled Level Conversion Circuit".

*Primary Examiner*—Edward P. Westin
*Assistant Examiner*—Benjamin D. Driscoll
*Attorney, Agent, or Firm*—Herbert F. Ruschmann; Thomas R. Morrison

[57] ABSTRACT

A BiMOS amplifier device includes one stage which can function as both a level-shift and buffer stage and an amplifier stage. The amplifier includes first and second bipolar transistors having their bases connected to first and second input terminals, respectively, having their collectors connected to a point of first potential, and having their emitters connected to the sources of first and second MOS transistors, respectively. The drains of the first and second MOS transistors are connected through respective impedance means to a point of second potential. The gate of each of the MOS transistors is connected to the drain of the other MOS transistor. An output terminal is connected to the drain of at least one of the MOS transistors.

17 Claims, 5 Drawing Sheets

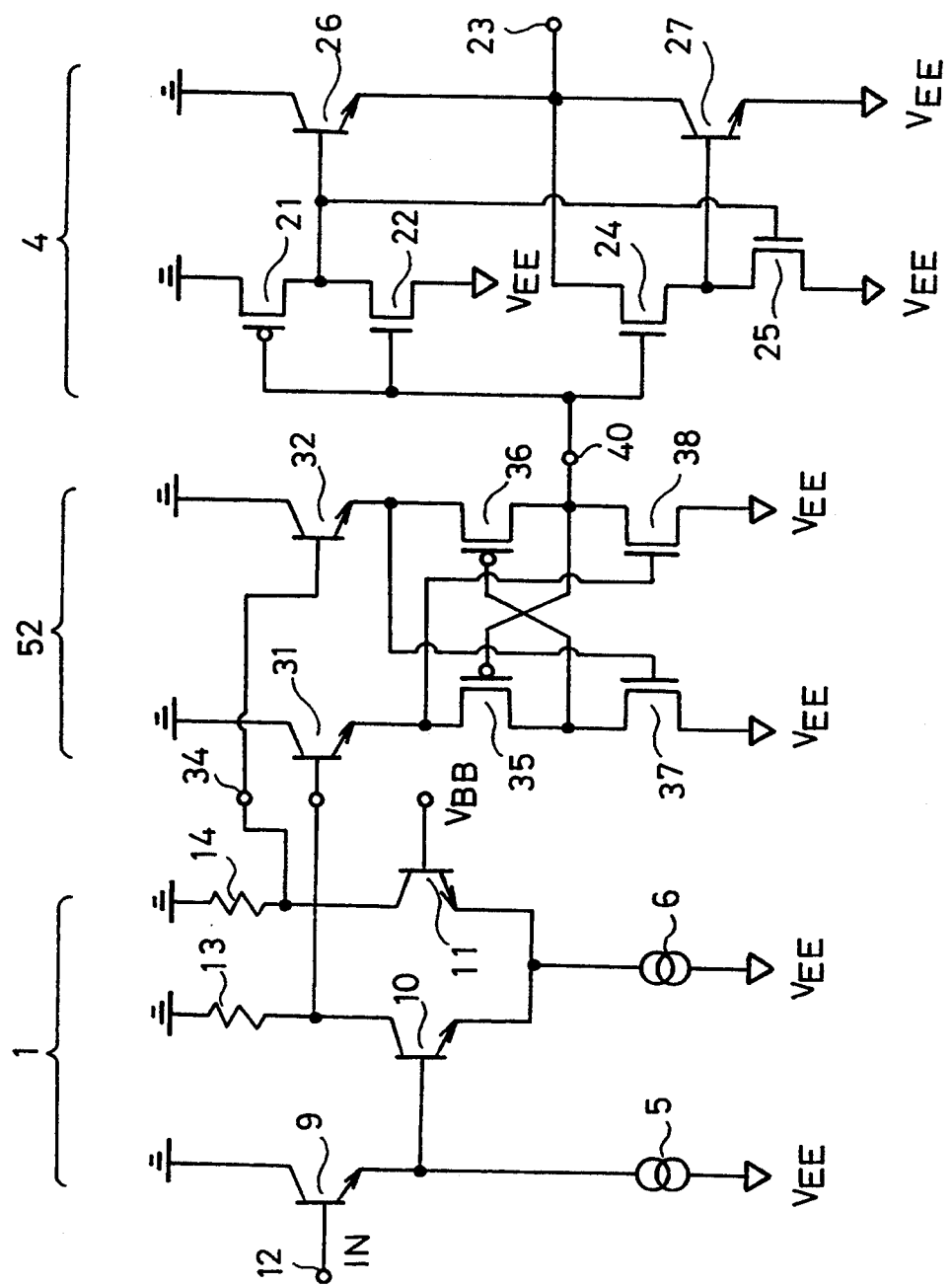
F I G. 5

LOW POWER BIMOS AMPLIFIER AND ECL-CMOS LEVEL CONVERTER

The present invention relates to a biMOS amplifier device including bipolar and MOS elements used in combination.

BACKGROUND OF THE INVENTION

FIG. 1 shows a conventional ECL-CMOS level conversion circuit. This circuit is shown in FIG. 3 of, "64K×1 BiCMOS ECL RAM with Cross Coupled Level Conversion Circuit" written by T. Shiomi et pages 532–540, *The Journal of The Institute of Electronics and Communication Engineers of Japan*, vol. J74-C-II, No. 6, June 1991.

The ECL-CMOS level conversion circuit shown in FIG. 1 comprises an input stage 1, a buffer stage 2, an amplifier stage 3, and a driver stage 4. These stages are supplied with a negative operating voltage $V_{EE}$ and a ground potential. The input stage 1 includes current sources 5 and 6. Buffer stage 2 includes current sources 7 and 8. The input stage 1 includes an input transistor 9, which is a bipolar transistor, and transistors 10 and 11 connected in a differential configuration. A signal input terminal 12 is connected to the base of the input transistor 9. The input terminal 12 receives a signal at an ECL (Emitter-Coupled Logic) level between, e.g., $-0.8$ V and $-1.8$ V, from an external ECL IC.

The signal applied to the input terminal 12 is compared with an externally applied constant bias voltage $V_{BB}$ in the differential amplifier comprising the transistors 10 and 11. Differential outputs developed across load resistors 13 and 14, respectively, are coupled to the bases of bipolar transistors 15 and 16, respectively, of the buffer stage 2. The transistors 15 and 16 decrease the voltage level of the signals at their bases toward $V_{EE}$ by 1 $V_{BE}$ (base-emitter voltage), i.e., about 0.7 V, and apply the thus level-shifted signals to PMOS (P-type MOS) transistors 17 and 18 of the amplifier stage 3, respectively.

The amplifier stage 3 includes the PMOS transistors 17 and 18 and a current mirror circuit comprising NMOS (N-type MOS) transistors 19 and 20. The amplifier stage 3 develops an amplified signal in a single-ended form in accordance with the signals applied thereto, and applies the amplified signal to the driver stage 4, which is a BiCMOS driver. The driver stage 4 includes a CMOS circuit comprising a series combination of a PMOS transistor 21 and an NMOS transistor 22 connected between a point of ground potential and a point of $V_{EE}$ potential, NMOS transistors 24 and 25 connected in series between an output terminal 23 and a point of $V_{EE}$ potential, and bipolar transistors 26 and 27 connected in series between a point of ground potential and a point of $V_{EE}$ potential. The output terminal 23 is connected to the junction of the emitter of the bipolar transistor 26 and the collector of the bipolar transistor 27.

The gates of the PMOS transistor 21 and the NMOS transistors 22 and 24 are connected together to the output of the amplifier stage 3. The drains of of the PMOS transistor 21 and the NMOS transistor 22 are connected together and also connected to the base of the transistor 26 and to the gate of the NMOS transistor 25. The base of the transistor 27 is connected to the junction of the NMOS transistors 24 and 25. An output signal developed at the output terminal 23 of the driver stage 4 is used to drive a number of gates within an LSI. The buffer stage 2 is used for preventing signal reflection which could be caused by signal coupling from stray capacitance as well as for providing the previously stated level shift in order to fully turn on the PMOS transistors 17 and 18 of the amplifier stage 3.

Considering, in particular, the buffer stage 2 and the amplifier stage 3 of the conventional BiMOS amplifier device shown in FIG. 1, it is seen that there are as many as four DC current paths between a point of ground potential and a point of $V_{EE}$ potential. This disadvantageously increases power consumption in these two stages.

SUMMARY OF THE INVENTION

An object of the present invention is to provide a BiMOS amplifier device with reduced power consumption, which can operate at a high speed and is particularly suitable for use in an ECL-CMOS level conversion circuit.

A BiMOS amplifier device according to the present invention comprises first and second input terminals for receiving complementary input signals, a first bipolar transistor having its base connected to the first input terminal and having its collector connected to a point of first potential, and a second bipolar transistor having its base connected to the second input terminal and having its collector connected to said first potential point. A first MOS transistor has its source connected to the emitter of first bipolar transistor and has its drain connected through first impedance means to a point of second potential. A second MOS transistor has its source connected to the emitter of the second bipolar transistor and has its drain connected through second impedance means to the second potential point The gate of the first MOS transistor is connected to the drain of the second MOS transistor, and the gate of the second MOS transistor is connected to the drain of the first MOS transistor. An output signal is derived from one or both of the drains of the first and second MOS transistors.

In the BiMOS amplifier device of the present invention. bipolar transistors which form input circuits not only perform a level-shifting operation, but also drive MOS transistors connected in series with the bipolar transistors to form output circuits. Thus, in the BiMOS amplifier device of the present invention, a single stage can achieve both level-shifting and amplifying operations. Therefore, power consumption is reduced.

BRIEF DESCRIPTION OF THE INVENTION

FIG. 5 is a circuit diagram of an ECL-CMOS level conversion circuit which uses the BiMOS amplifier device of the first embodiment of the present invention;

Figure 1:
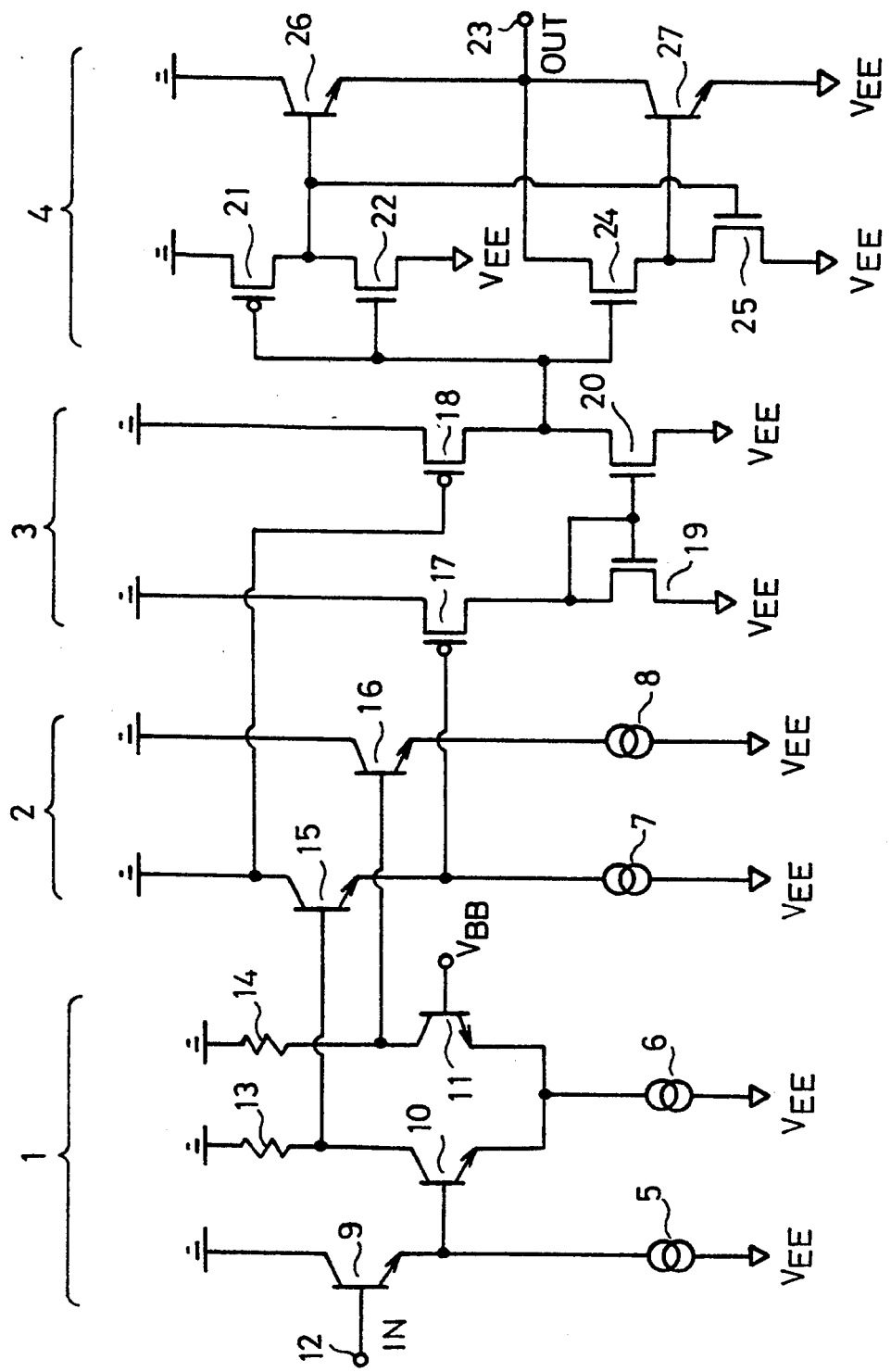
FIG. 1 is a circuit diagram of an example of conventional level conversion circuit according to the prior art.
Figure 6:
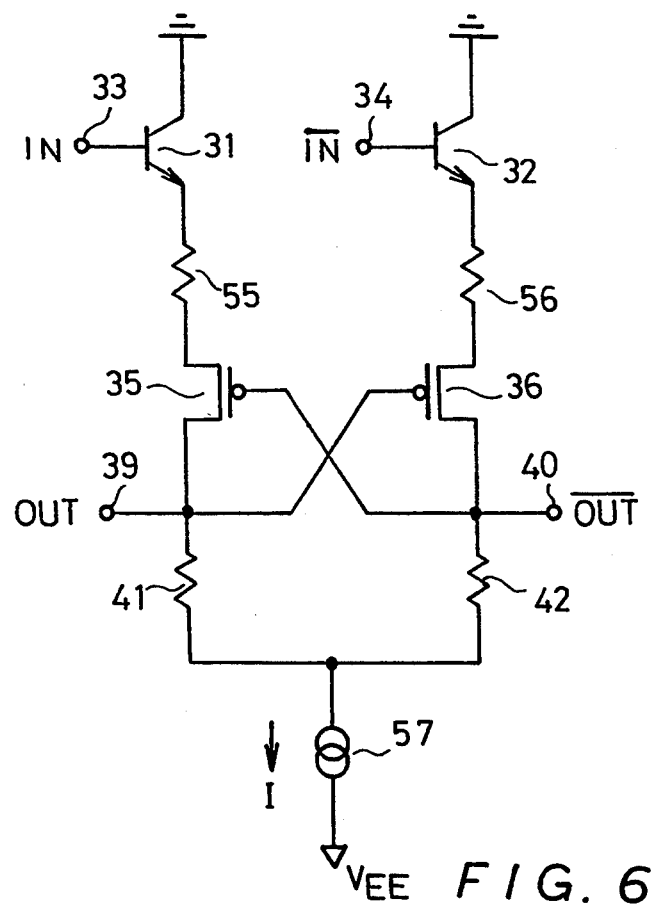
Figure 7:
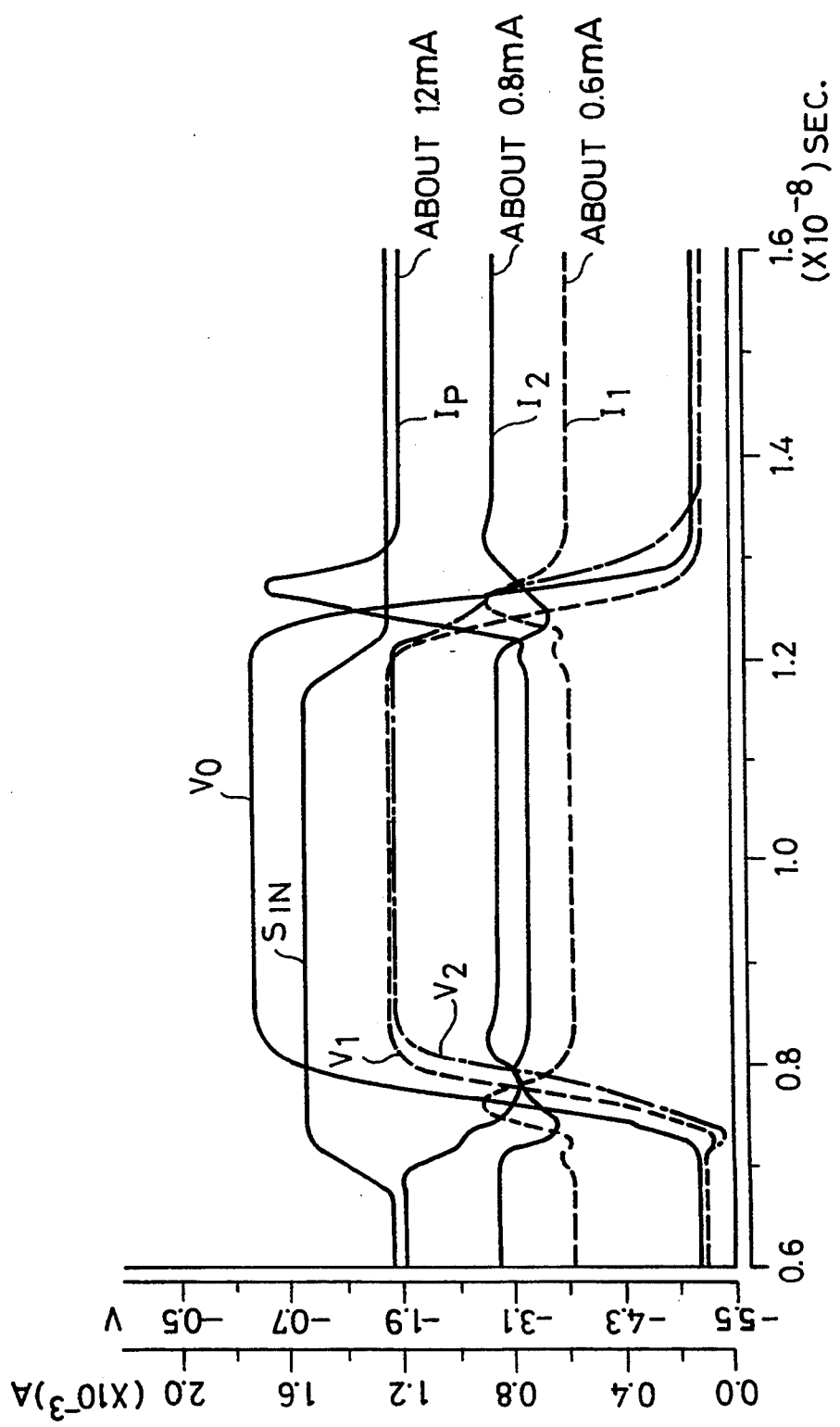

FIG. 6 is a circuit diagram of a BiMOS amplifier device according to a fourth embodiment of the present invention; and FIG. 7 shows output voltages and output currents the BiMOS amplifier devices according to the first and second embodiments of the invention, contrasted to the combined output voltage and current of the buffer and amplifier stages of the conventional level conversion circuit of FIG. 1.

The above, and other objects, features, and advantages of the present invention will become apparent from the following description read in conjunction with the accompanying drawings, in which like reference numerals designate the same elements.

DETAILED DESCRIPTION OF PREFERRED EMBODIMENTS

Figure 2:
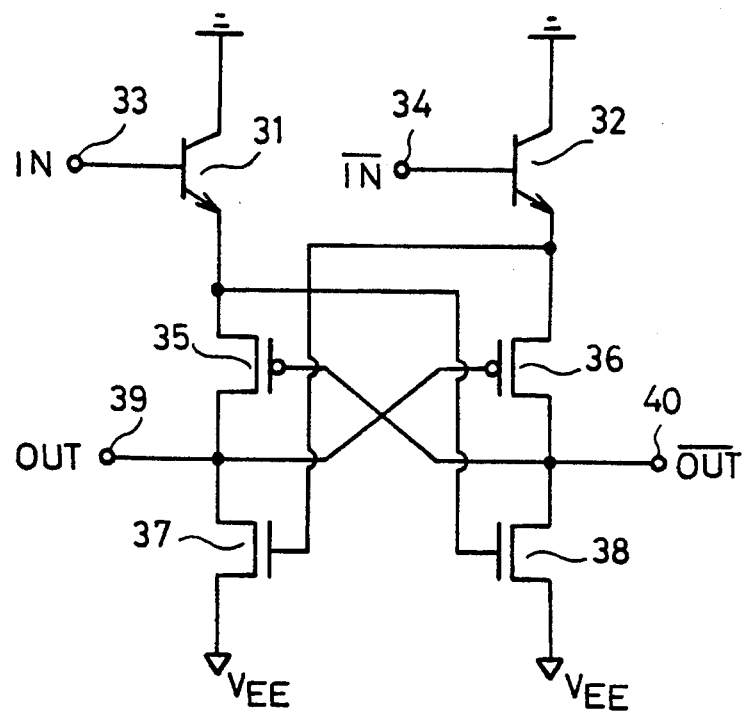
FIG. 2 is a circuit diagram of a BiMOS amplifier device according to a first embodiment of the present invention.

FIG. 2 shows a BiMOS amplifier according to a first embodiment of the present invention. In FIG. 2, the base of a first transistor, for example, a NPN bipolar transistor 31, which forms an input circuit, is connected to a first input terminal 33, and the collector of the bipolar transistor 31 is connected to a point of first potential, for example, ground. The emitter of the bipolar transistor 31 is connected to the source of of a first PMOS transistor 35 forming an output circuit. The MOS transistor 35 has its drain connected to the drain of a first NMOS transistor 37 which acts as impedance means. The source of the first NMOS transistor 37 is connected to a point of second potential, $V_{EE}$.

Similarly, a second NPN bipolar transistor 32, a second PMOS transistor 36, and a second NMOS transistor 38 are connected in series between the first potential point, (ground), and the second potential point, ($V_{EE}$). The base of the bipolar transistor 32 is connected to a second input terminal 34. The second input terminal 34 receives an input signal that is complementary to the input signal applied to the first input terminal 33.

The gate of the first PMOS transistor 35 is connected to the drain of the second PMOS transistor 36, and the gate of the second PMOS transistor 36 is connected to the drain of the first PMOS transistor 35. The gate of the first NMOS transistor 37 is connected to the emitter of the second bipolar transistor 32, and the gate of the NMOS transistor 38 is connected to the emitter of the first bipolar transistor 31. A first output terminal 39 is connected to the interconnected drains of the first PMOS transistor 35 and the first NMOS transistor 37, and a second output terminal 40 is connected to the interconnected drains of the second PMOS transistor 36 and the second NMOS transistor 38.

In the BiMOS amplifier circuit shown in FIG. 1, let it be assumed that complementary input signals IN and $\overline{IN}$ having an amplitude of about 1 V are applied to the input terminals 33 and 34, respectively. A bipolar transistor exhibits a base-emitter voltage $V_{BE}$ of about 0.7 V when it is turned on. Accordingly, a signal having an amplitude of about 1 V which is level-shifted by about 0.7 V toward $V_{EE}$ is applied to the source of each of the PMOS transistors 35 and 36 which form output circuits.

As an example, when the input signal IN at the input terminal 33 is at a high level, i.e. H, the input signal $\overline{IN}$ applied to the input terminal 34 is at a low level, i.e., L. Then, the first PMOS transistor 35 is ON, the second PMOS transistor 36 is OFF, the first NMOS transistor 37 is OFF, and the second NMOS transistor 38 is ON. This results in the development of an output signal at the H level at the first output terminal 39, while an L output signal complementary to the output signal at the first output signal 39 is developed at the second output terminal 40. When the input signal applied to the first input terminal 33 is L and the input signal at the second input terminal 34 is H, the output signals at the output terminals 39 and 40 are L and H, respectively. In this case, the amplitude of the output signals at the respective output terminals is approximately $V_{EE} - V_{BE} - \alpha$, where $\alpha$ is a voltage determined by the resistance of a PMOS transistor when it is ON, which voltage is about 0.5–1.0 V.

As described above, the BiMOS amplifier device of FIG. 2, which includes only two DC current paths, can operate not only as a level-shifter and buffer but also as an amplifier, so that current and power consumption is reduced. Further, because of a reduced number of stages, the operating speed is increased.

Figure 3:
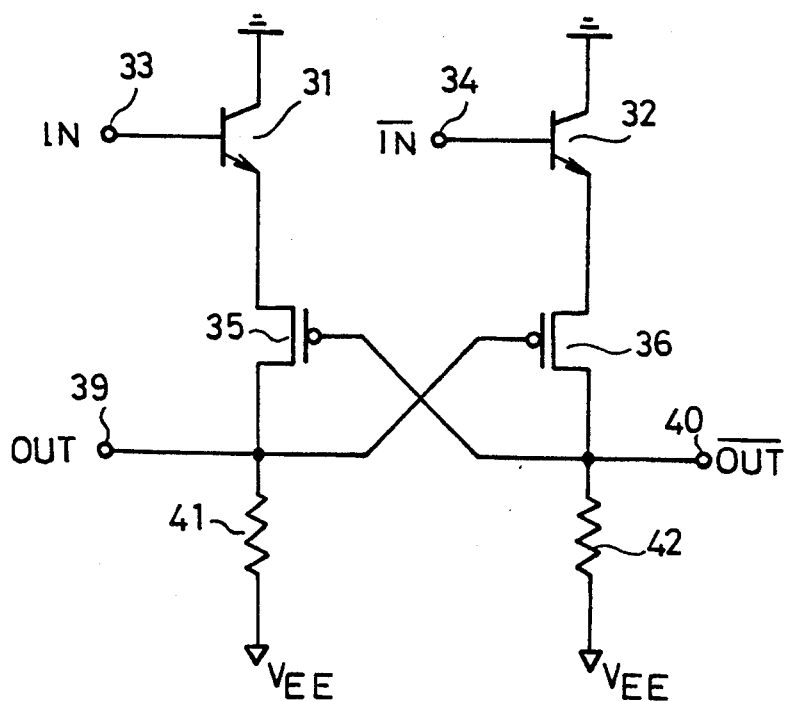
FIG. 3 is a circuit diagram of a BiMOS amplifier device according to a second embodiment of the present invention.

FIG. 3 shows a BiMOS amplifier device according to a second embodiment of the present invention, which is similar to the one shown in FIG. 2. In this embodiment resistors 41 and 42 are impedance means for connecting the drains of the PMOS transistors 35 and 36 to the point of second potential $V_{EE}$. The BiMOS amplifier device of FIG. 3 operates in substantially the same manner as the amplifier device of FIG. 2.

Figure 4:
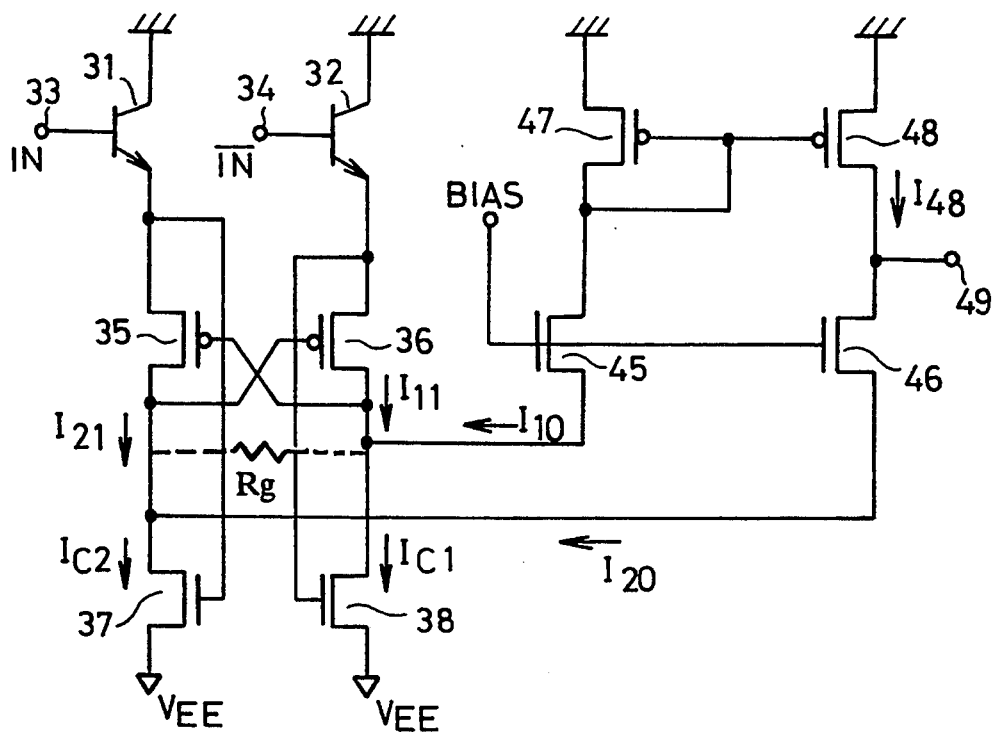
FIG. 4 is a circuit diagram of a BiMOS amplifier device according to a third embodiment of the present invention.

FIG. 4 shows a BiMOS amplifier device according to a third embodiment of the present invention. The BiMOS amplifier device of FIG. 4 comprises the same circuit as the first embodiment shown in FIG. 2. In addition, in order to achieve a higher operating speed, the interconnected drains of the first PMOS transistor 35 and the first NMOS transistor 37 and the interconnected drains of the second PMOS transistor 36 and the second NMOS transistor 38 are further connected through respective NMOS transistors 46 and 45 to PMOS transistors 48 and 47, respectively, forming a current mirror circuit. A constant bias voltage is applied to the gates of the NMOS transistors 45 and 46 from a bias source (not shown).

In FIG. 4, let it be assumed that currents $I_{c1}$ and $I_{c2}$ flow through the MOS transistors 38 and 37, respectively, currents $I_{21}$ and $I_{11}$ flow through the MOS transistors 35 and 36, respectively, and currents $I_{10}$ and $I_{20}$ flow through the MOS transistors 45 and 46, respectively. The following relationships are established between these currents.

$$I_{c1} = I_{10} + I_{11} \tag{1}$$

$$I_{c2} = I_{20} + I_{21} \tag{2}$$

When the input signal IN applied to the input terminal 33 is H and the input signal $\overline{IN}$ applied to the input terminal 34 is L, $I_{21} > I_{c2}$ and $I_{11} = 0 < I_{c1}$. Then, from the equations (1) and (2), $$I_{10} = I_{c1} - I_{11} = I_{c1} \tag{3}$$

$$I_{20} = I_{c2} - I_{21} < 0 \tag{4}$$

(In some cases, the NMOS transistor 46 may be turned off). From the equations (3) and (4), $I_{10} > I_{20}$.

Since the PMOS transistors 47 and 48 form a current mirror circuit, current $I_{48}$, flowing through the MOS transistor 48, is equal to $I_{10}$ which is equal to $I_{c1}$ current $I_{48}$ flows (not shown) into a load, externally connected to the output terminal 49 at a junction of the transistors 48 and 46 since $I_{20} < 0$. This current charges up a load capacitance, which results in an output voltage at a high level H. When IN=L and $\overline{IN}$=H, $I_{11} > I_{c1}$ and $I_{21} = 0 < I_{c2}$, and, $$I_{10} = I_{c1} - I_{11} < 0 \tag{5}$$

$$I_{20} = I_{c2} - I_{21} = I_{c2} \tag{6}$$

Turning on also NMOS transistor 37 causes the NMOS transistor 46 to turn on, so that $I_{20}$, which is equal to $I_{c2}$, flows from the load through the output terminal 49 and the NMOS transistors 46 and 37. This causes the load capacitance to be discharged, which, in turn, causes the output voltage L to become low. Thus, a level-shifted and amplified output signal is developed at the output terminal 49 as in the embodiments shown in FIGS. 2 and 3.

It should be noted that a gain adjustment resistor $R_g$ may optionally be connected between the drains of the MOS transistors 35 and 36 of the BiMOS amplifier device of the present invention shown in FIG. 4.

FIG. 5 shows an ECL-CMOS level conversion circuit which uses a BiMOS amplifier device arranged in accordance with the first embodiment of the present invention shown in FIG. 2. The circuit of FIG. 5 includes an input stage 1 and a driver stage 4 both of which are similar to the input stage 1 and the driver stage 4 of the conventional level conversion circuit shown in FIG. 1. The ECL-CMOS level conversion circuit of FIG. 5 uses a BiMOS amplifier device 52 which is the same as the one shown in FIG. 2. In the circuit of FIG. 5, the second output terminal 40 at which an output signal $\overline{OUT}$ is developed is connected to the driver stage 4. As stated previously, the BiMOS amplifier device 52 performs functions of both of the buffer stage 2 and the amplifier stage 3 of the conventional level conversion circuit of FIG. 1. Because BiMOS amplifier device 52, which functions as both buffer and amplifier stages, has a reduced power consumption, the ECL-CMOS level conversion circuit of FIG. 5 consumes less power than the conventional circuit of FIG. 1.

FIG. 6 shows a BiMOS amplifier device according to a fourth embodiment of the present invention, which comprises the same circuit as shown in FIG. 3. In addition, resistors 55 and 56 are connected between the emitter of the bipolar transistor 31 and the source of the PMOS transistor 35 and between the emitter of the bipolar transistor 32 and the source of the PMOS transistor 36, respectively, for adjustment of the amount of level-shift. The resistors 41 and 42 are connected in common to a current supply 57.

In the BiMOS amplifier device of FIG. 6, the amplification factor can be controlled by adjusting the value of current I, supplied from the current supply 57 and the values of the resistors 41 and 42. The amount of level shift can also be controlled by adjusting the value of current I and the values of the resistors 55 and 56. This circuit also has reduced power consumption.

FIG. 7 shows the results of experiments for measuring changes in the combined output voltage $V_0$ and the total current $I_p$ of the buffer stage 2 and the amplifier stage 3 of the conventional level conversion circuit of FIG. 1, with changes in an input signal $S_{IN}$, and changes of the output voltage $V_1$ and the current $I_1$ of the circuit of the present invention shown in FIG. 2 and changes in the output voltage $V_2$ and the current $I_2$ of the circuit of the present invention shown in FIG. 3, respectively, with changes of the input signal $S_{IN}$. As shown, when the input signal $S_{IN}$ is L, the total current $I_p$ of the buffer stage 2 and the amplifier stage 3 of the conventional level conversion circuit is about 1.2 mA, whereas the current $I_1$ is about 0.6 mA, and the current $I_2$ is about 0.8 mA. Thus, according to the present invention, current is reduced to from $\frac{1}{2}$ to $\frac{2}{3}$ of the current in the conventional circuits and, therefore, power consumption is reduced. Although not shown in FIG. 7, experiments revealed that the embodiments shown in FIGS. 4 and 6 also exhibited substantially the same values of current and power consumption as the embodiment of FIGS. 2 and 3.

As described above, with a BiMOS amplifier device according to the present invention, a level-shifter and buffer stage and an amplifier stage of a conventional level conversion circuit can be formed in one stage with a reduced number of DC current paths, so that current and power consumption can be reduced. Furthermore, because of the reduction of the number of stages, the circuit can operate faster.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A BiMOS amplifier device comprising:
   first and second input terminals;
   a first bipolar transistor having a base connected to said first terminal, and having a collector connected to a point of first potential;
   a second bipolar transistor having a base connected to said second terminal, and having a collector connected to said point of said first potential;
   first and second impedance means;
   a first MOS transistor having a source connected to an emitter of said first bipolar transistor, and having a drain connected through the first impedance means to a point of second potential;
   a second MOS transistor having a source connected to an emitter of said second bipolar transistor, and having a drain connected through the second impedance means to said point of second potential;
   a gate of each one of said MOS transistors being connected to the drain of the other one of said MOS transistors; and
   an output terminal connected to the drain of one of said first and second MOS transistors.

2. A BiMOS amplifier device according to claim 1 wherein said first and second impedance means are third and fourth MOS transistors, respectively, with the gate of said third MOS transistor being connected to the emitter of said second bipolar transistor and with the gate of said fourth MOS transistor being connected to the emitter of said first bipolar transistor.

3. A BiMOS amplifier device comprising:
   first and second input terminals;
   a first bipolar transistor having a base connected to said first terminal, and having a collector connected to a point of first potential;
   a second bipolar transistor having a base connected to said second terminal, and having a collector connected to said point of said first potential;
   first and second impedance means;

a first MOS transistor having a source connected to an emitter of said first bipolar transistor, and having a drain connected through the first impedance means to a point of second potential;

a second MOS transistor having a source connected to an emitter of said second bipolar transistor, and having a drain connected through the second impedance means to said point of second potential;

a gate of each one of said MOS transistors being connected to the drain of the other one of said MOS transistors;

an output terminal connected to the drain of one of said first and second MOS transistors; and said first and second impedance means being resistors.

4. A BiMOS amplifier device comprising:

first and second input terminals;

a first bipolar transistor having a base connected to said first terminal, and having a collector connected to a point of first potential;

a second bipolar transistor having a base connected to said second terminal, and having a collector connected to said point of said first potential;

first and second impedance means;

a first MOS transistor having a source connected to an emitter of said first bipolar transistor, and having a drain connected through the first impedance means to a point of second potential;

a second MOS transistor having a source connected to an emitter of said second bipolar transistor, and having a drain connected through the second impedance means to said point of second potential;

a gate of each one of said MOS transistors being connected to the drain of the other one of said MOS transistors;

an output terminal connected to the drain of one of said first and second MOS transistors; and a current mirror circuit connected between the drains of said first and second MOS transistors and said point of said first potential.

5. A BiMos amplifier device according to claim 4 wherein a gain adjustment resistor is connected between the drains of said first and second MOS transistors.

6. A BiMOS amplifier device comprising:

first and second input terminals;

a first bipolar transistor having a base connected to said first terminal, and having a collector connected to a point of first potential;

a second bipolar transistor having a base connected to said second terminal, and having a collector connected to said point of first potential;

first and second gain adjustment resistors;

a first MOS transistor having a source connected to an emitter of said first bipolar transistor, and having a drain connected to one end of said first gain adjustment resistor;

a second MOS transistor having a source connected to an emitter of said second bipolar transistor, and having a drain connected to one end of said second gain adjustment resistor;

a gate of each one of said MOS transistors being connected to the drain of the other one of said MOS transistors;

a common current supply connected between the respective other ends of said first and second gain adjustment resistors and a point of second potential; and an output terminal connected to the drain of one of said first and second MOS transistors.

7. An amplifier comprising:

first and second bipolar transistors;

said first and second bipolar transistors having a having first and second bases, first and second emitters, and first and second collectors, respectively;

means for connecting said first and second bases to first and second signals, respectively;

said first and second collectors being connected to a first electric potential;

first and second MOS transistors;

said first and second MOS transistors having first and second sources connected to said first and second emitters, respectively;

said first and second MOS transistors having first and second gates and first and second drains, respectively;

said first and second gates being connected to said second and first drains, respectively;

first and second impedances; and said first and second impedances being disposed between said first and second drains and a second electric potential, respectively.

8. An amplifier according to claim 1, wherein said first and second impedance includes third and fourth MOS transistors having gates controlled such that said third and fourth MOS transistors are substantially maintained in a state of conduction opposite that of said first and second MOS transistors, respectively.

9. A BiMOS amplifier device comprising:

first and second input terminals;

a first bipolar transistor having a base connected to said first terminal, and having a collector connected to a point of first potential;

a second bipolar transistor having a base connected to said second terminal, and having a collector connected to said point of said first potential;

first and second impedance means;

a first MOS transistor having a source connected to an emitter of said first bipolar transistor, and having a drain connected through the first impedance means to a point of second potential;

a second MOS transistor having a source connected to an emitter of said second bipolar transistor, and having a drain connected through the second impedance means to said point of second potential;

a gate of each one of said MOS transistors being connected to the drain of the other one of said MOS transistors;

an output terminal connected to the drain of one of said first and second MOS transistors;

said first and second impedance means including third and fourth MOS transistors, respectively; and gates of said third and fourth MOS transistors being connected to said emitters of said second and first bipolar transistors, respectively.

10. An amplifier according to claim 1, wherein said first and second MOS transistors are P-type.

11. An amplifier according to claim 8, wherein said third and fourth MOS transistors are N-type.

12. An amplifier comprising:

first and second input terminals;

a first bipolar transistor having a base connected to said first terminal, and having a collector connected to a point of first potential;

a second bipolar transistor having a base connected to said second terminal, and having a collector connected to said point of said first potential;

first and second impedance means;

a first MOS transistor having a source connected to an emitter of said first bipolar transistor, and having a drain connected through the first impedance means to a point of second potential;

a second MOS transistor having a source connected to an emitter of said second bipolar transistor, and having a drain connected through the second impedance means to said point of second potential;

a gate of each one of said MOS transistors being connected to the drain of the other one of said MOS transistors;

an output terminal connected to the drain of one of said first and second MOS transistors;

said first and second impedance means being first and second resistors, respectively;

a current source between said first and second resistors and said second electric potential;

a third resistor disposed between said emitter of said first bipolar transistor and said source of said first MOS transistor; and a fourth resistor disposed between said emitter of said second bipolar transistor and said source of said second MOS transistor.

13. An amplifier comprising:

first and second input terminals;

a first bipolar transistor having a base connected to said first terminal, and having a collector connected to a point of first potential;

a second bipolar transistor having a base connected to said second terminal, and having a collector connected to said point of said first potential;

first and second impedance means;

a first MOS transistor having a source connected to an emitter of said first bipolar transistor, and having a drain connected through the first impedance means to a point of second potential;

a second MOS transistor having a source connected to an emitter of said second bipolar transistor, and having a drain connected through the second impedance means to said point of second potential;

a gate of each one of said MOS transistors being connected to the drain of the other one of said MOS transistors;

an output terminal connected to the drain of one of said first and second MOS transistors;

a current mirror having first and second current terminals;

said first and second current terminals each being connected to said drains of said first and second MOS transistors, respectively.

14. An amplifier according to claim 13 wherein said current mirror includes:

first and second transistors in series between said first electric potential and said first current terminal;

third and fourth transistors in series between said first electric potential and said second current terminal;

said first transistor having a gate and a drain connected together;

said gate of said first transistor being connected to a gate of said third transistor; and a third output terminal disposed between said third and fourth transistors.

15. An amplifier comprising:

first, second, third and fourth transistors;

first and second impedances;

said first transistor, third transistor, and first impedance being connected in series between first and second electric potentials;

said second transistor, fourth transistor, and second impedance being connected in series between said first and second electric potentials;

said third transistor being conductive responsive to said first transistor being conductive and said second and fourth transistors being non-conductive;

said third transistor being non-conductive responsive to said first transistor being non-conductive and said second and fourth transistors being conductive;

an output connected to an interconnection of one of said third transistor and said first impedance, and said fourth transistor and said second impedance;

said fourth transistor being non-conductive responsive to said first and third transistor being conductive and said second transistor being non-conductive;

said fourth transistor being conductive responsive to said first and third transistors being non-conductive and said second transistor being conductive;

said first impedance having a control terminal and said second transistor having an emitter connected thereto for controlling a conductance of said first impedance in accordance with a conductive state of said second transistor; and said second impedance having a control terminal and said first transistor having an emitter connected thereto for controlling a conductance of said second impedance in accordance with a conductive state of said first transistor.

16. An amplifier according to claim 15, where said first and second transistors are bipolar transistors.

17. An amplifier according to claim 15, where said third and fourth transistors are PMOS transistors.

* * * * *

UNITED STATES PATENT AND TRADEMARK OFFICE
CERTIFICATE OF CORRECTION

PATENT NO. : 5,371,421
DATED : December 6, 1994
INVENTOR(S) : Harufusa Kondoh, et. al.

It is certified that error appears in the above-indentified patent and that said Letters Patent is hereby corrected as shown below:

Title page, item [73], Assignee:  should read-- Mitsubishi Denki Kabushiki Kaisha, Tokyo, Japan.--

Signed and Sealed this

Seventh Day of May, 1996

Attest:

BRUCE LEHMAN

*Attesting Officer*     Commissioner of Patents and Trademarks